United States Patent
Okashita et al.

(10) Patent No.: US 8,012,862 B2
(45) Date of Patent: Sep. 6, 2011

(54) METHOD FOR MANUFACTURING SEMICONDUCTOR DEVICE USING PLASMA DOPING

(75) Inventors: Katsumi Okashita, Osaka (JP); Yuichiro Sasaki, Osaka (JP); Keiichi Nakamoto, Osaka (JP); Bunji Mizuno, Nara (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/741,132

(22) PCT Filed: Oct. 2, 2008

(86) PCT No.: PCT/JP2008/002774
§ 371 (c)(1),
(2), (4) Date: May 3, 2010

(87) PCT Pub. No.: WO2009/066409
PCT Pub. Date: May 28, 2009

(65) Prior Publication Data
US 2010/0255615 A1    Oct. 7, 2010

(30) Foreign Application Priority Data
Nov. 22, 2007 (JP) ................... 2007-302504

(51) Int. Cl.
*H01L 21/26* (2006.01)
(52) U.S. Cl. ............................................. 438/513
(58) Field of Classification Search .......... None
See application file for complete search history.

(56) References Cited

U.S. PATENT DOCUMENTS

| | | | |
|---|---|---|---|
| 5,783,492 | A | 7/1998 | Higuchi et al. |
| 7,192,854 | B2 | 3/2007 | Sasaki et al. |
| 2005/0202618 | A1 | 9/2005 | Yagishita |
| 2005/0287776 | A1 | 12/2005 | Sasaki et al. |
| 2008/0111185 | A1* | 5/2008 | Cheng ........................... 257/347 |
| 2009/0004806 | A1* | 1/2009 | Siprak ........................... 438/306 |
| 2009/0008705 | A1* | 1/2009 | Zhu et al. ...................... 257/327 |
| 2009/0057761 | A1* | 3/2009 | Kim et al. ...................... 257/344 |
| 2009/0215250 | A1* | 8/2009 | Santhanam et al. .......... 438/513 |

FOREIGN PATENT DOCUMENTS

| | | |
|---|---|---|
| JP | 2004-179592 | 6/2004 |
| JP | 2005-294789 | 10/2005 |
| WO | WO 2005/034221 A1 | 4/2005 |
| WO | WO 2008/090771 A1 | 7/2008 |

OTHER PUBLICATIONS

D. Lenoble et al., "Enhanced performance of PMOS MUGFET via integration of conformal plasma-doped source/drain extensions," 2006 Symposium of VLSI Technology Digest of Technical Papers, p. 212.

* cited by examiner

*Primary Examiner* — Scott B Geyer
(74) *Attorney, Agent, or Firm* — McDermott Will & Emery LLP (57) ABSTRACT

A fin-shaped semiconductor region is formed on a substrate, and then the substrate is placed in a chamber. Then, an ignition gas is introduced into a chamber to thereby turn the ignition gas into a plasma, and then a process gas containing an impurity is introduced into the chamber to thereby turn the process gas into a plasma. Then, a bias voltage is applied to the substrate so as to dope the semiconductor region with the impurity after confirming attenuation of an amount of the ignition gas remaining in the chamber.

12 Claims, 8 Drawing Sheets

Where Bias Is Applied When Ii≦Ip (b)

Where Bias Is Applied When Ii>Ip

METHOD FOR MANUFACTURING SEMICONDUCTOR DEVICE USING PLASMA DOPING

RELATED APPLICATIONS

This application is the U.S. National Phase under 35 U.S.C. §371 of International Application No. PCT/JP2008/002774, filed on Oct. 2, 1008, which in turn claims the benefit of Japanese Application No. 2007-302504, filed on Nov. 22, 2007, the disclosures of which Applications are incorporated by reference herein.

TECHNICAL FIELD

The present invention relates to a method for manufacturing a semiconductor device in which a plasma doping is used for implanting an impurity into a semiconductor.

BACKGROUND ART

As a technique for introducing an impurity into a semiconductor, a plasma doping method is known in the art in which an impurity is introduced into a semiconductor in the form of ions with a low energy.

A gas containing an impurity such as boron or arsenic diluted with helium or hydrogen is used as the process gas for plasma doping (see Patent Document 1).

CITATION LIST

Patent Document

PATENT DOCUMENT 1: U.S. Pat. No. 7,192,854
PATENT DOCUMENT 2: Japanese Patent No. 3204836

Non-Patent Document

NON-PATENT DOCUMENT 1: D. Lenoble, et al., Enhanced performance of PMOS MUGFET via integration of conformal plasma-doped source/drain extensions, 2006 Symposium on VLSI Technology Digest of Technical Papers, p. 212

SUMMARY OF THE INVENTION

Technical Problem

Figure 10:
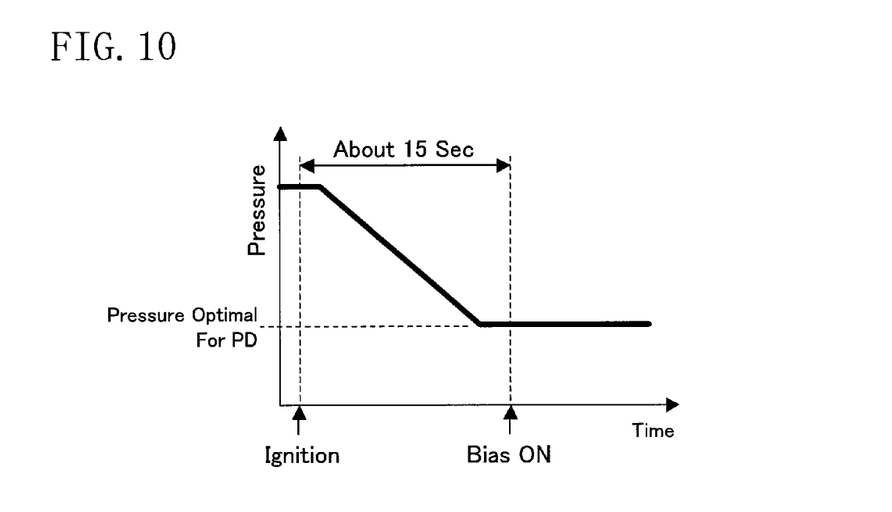
FIG. 10 shows an example of a temporal change of the pressure inside the chamber in a case where a plasma doping is performed by using only a process gas.

However, a gas that contains a large amount of helium or hydrogen is unlikely to be turned into a plasma (ignited) under a low pressure. Therefore, it is necessary to increase the pressure inside the chamber in order to turn into a plasma a process gas that contains a large amount of helium or hydrogen. FIG. 10 shows an example of a temporal change of the pressure inside the chamber where a plasma doping (PD) is carried out by using only a process gas. As shown in FIG. 10, the pressure inside the chamber is set high in order to generate a plasma only by a process gas, and it is therefore necessary to lower the pressure inside the chamber after the plasma generation to a pressure optimal for the plasma doping (PD) before applying a bias to a subject substrate to carry out the plasma doping. That is, where a plasma is generated by using only a process gas, a relatively long period of time (e.g., about 15 seconds) is required for the pressure adjustment, as shown in FIG. 10, thus lowering the throughput.

In view of the above, an object of the present invention is to improve the throughput of a plasma doping process.

Solution to the Problem

Argon is known as a gas that is easily turned into a plasma (a gas that is easily excited to discharge) (see Patent Document 2). In view of this, the present inventors conceived a method in which argon is used as a gas for plasma ignition (hereinafter referred to as an "ignition gas"), wherein a plasma is generated using the ignition gas under a low pressure that is suitable for a plasma doping, and then the gas to be introduced into the chamber is switched from the ignition gas to a process gas.

Then, the present inventors applied this method to a method for forming a three-dimensional transistor (see Non-Patent Document 1), which has been drawing attention as a plasma doping application. Specifically, a plasma was generated by using an ignition gas and then a plasma doping was performed by using a process gas in order to introduce an impurity by a plasma doping into a semiconductor region having an upper surface and a side surface (fin-shaped semiconductor region). As a result, it was possible to improve the throughput as compared with a conventional plasma doping process because the amount of time required for the pressure adjustment is substantially eliminated.

However, when a plasma doping was performed on a fin-shaped semiconductor region by generating a plasma using an ignition gas, we encountered a new, unpredicted problem that the upper corner of the fin-shaped semiconductor region chips off to a non-negligible degree.

As a result of researching on the cause of the new problem, the present inventors arrived at the following findings.

Gas supply and gas discharge take place simultaneously in and out of a chamber used in a plasma doping so as to maintain the pressure inside the chamber at a predetermined pressure. Therefore, after a plasma is generated using an ignition gas, and then the supply of the process gas is started while stopping the supply of the ignition gas, the ignition gas remains in the chamber for a while. On the other hand, the argon gas, which is used as the ignition gas, has a relatively high etch rate to a semiconductor such as silicon. That is, when a plasma doping is performed by starting the supply of the process gas and the application of the bias while the ignition gas remains in the chamber, the semiconductor such as silicon, particularly, the upper corner of the fin-shaped semiconductor region is significantly etched and rounded.

Based on these findings, the present inventors conceived an invention as follows, as a method of a plasma doping for a fin-shaped semiconductor region, which reliably prevents chipping of the upper corner while maintaining a high throughput.

A method for manufacturing a semiconductor device of the present invention includes the steps of: (a) forming a semiconductor region having an upper surface and a side surface on a substrate; (b) introducing an ignition gas into a chamber to thereby turn the ignition gas into a plasma after the substrate is placed in the chamber, after the step (a); (c) introducing a process gas containing an impurity into the chamber to thereby turn the process gas into a plasma, after the step (b); and (d) applying a bias voltage to the substrate so as to dope the semiconductor region with the impurity after confirming attenuation of an amount of the ignition gas remaining in the chamber, after the step (c).

According to the method for manufacturing a semiconductor device of the present invention, an ignition gas is used separately from a process gas, and it is therefore possible to generate a plasma with a low pressure. That is, since the pressure difference between the plasma ignition and the impurity doping can be reduced, the amount of time required for the pressure adjustment is substantially eliminated, and it is therefore possible to improve the throughput.

According to the method for manufacturing a semiconductor device of the present invention, a bias is applied to the substrate after confirming the attenuation of the amount of the ignition gas remaining in the chamber, and it is therefore possible to reliably prevent the chipping of the upper corner of the semiconductor region due to the ignition gas.

In the method for manufacturing a semiconductor device of the present invention, the ignition gas may contain a rare gas, wherein the rare gas may be Ne, Ar or Xe. Since these gases are easily excited to discharge, a plasma can be generated easily even with a pressure as low as that during the impurity doping, thereby reliably improving the throughput. Moreover, since these gases are chemically stable, it is possible to stably perform the plasma doping process. Particularly, a significant advantage as follows can be obtained when an Ne (neon) gas is used as the ignition gas since the atomic weight of neon is smaller than Ar (argon), etc.

First, if an Ne gas is used, it is possible to more reliably prevent the chipping (rounding) of the upper corner of the semiconductor region since the sputtering rate is low.

Now, in order to form a source/drain region and an extension region, an impurity such as boron or arsenic is implanted into a single crystal silicon substrate, after which a step of electrically activating the implanted impurity through annealing is performed. Here, the surface portion of the single crystal structure is reformed to be amorphous by the plasma doping, but crystal recovery takes place in the annealing step so that a source/drain region and an extension region having a single crystal structure are formed after annealing. During the plasma doping, Ne, Ar, etc., are also implanted, though in slight amounts, into the single crystal silicon substrate together with the impurity. In the case of Ne, however, it is more easily discharged out of the single crystal silicon substrate through out-diffusion during the annealing step as compared with Ar or Xe, since it is very small relative to Ar or Xe. On the other hand, Ar or Xe is large and is less likely to out-diffuse during the annealing step, and is therefore likely to inhibit crystal recovery, resulting in a crystal defect. Particularly, in the formation of an impurity region having a PN junction at a very shallow position, such as an extension region, such a crystal defect is fatal since it can cause junction leak current. Note that for an extension region, a shallow junction at 20 nm or less has been demanded currently, and a shallow junction at 10 nm or less is demanded for the future.

For these reasons, it is particularly preferred to use an Ne gas as the rare gas contained in the ignition gas.

In the method for manufacturing a semiconductor device of the present invention, the ignition gas may contain N, O, S, Cl or Br. Since these gases are easily excited to discharge, a plasma can be generated easily even with a pressure as low as that during the impurity doping, thereby reliably improving the throughput.

In the method for manufacturing a semiconductor device of the present invention, the process gas may contain a diluent gas, wherein the diluent gas may be He or $H_2$. Then, since He (helium) or $H_2$ (hydrogen) has a low etch rate to a semiconductor, it is possible to more reliably prevent the chipping (rounding) of the upper corner of the semiconductor region.

Particularly, helium is a rare gas and is therefore very stable chemically. Moreover, the etch rate of helium to a semiconductor is even smaller than that of hydrogen, which has a smaller etch rate to a semiconductor than other atoms, and it is therefore possible to more reliably prevent the chipping (rounding) of the upper corner of the semiconductor region.

Now, as described above, in order to form a source/drain region and an extension region, an impurity such as boron or arsenic is implanted into a single crystal silicon substrate, after which a step of electrically activating the implanted impurity through annealing is performed. Here, the surface portion of the single crystal structure is reformed to be amorphous by the plasma doping, but crystal recovery takes place in the annealing step so that a source/drain region and an extension region having a single crystal structure are formed after annealing. Here, during the plasma doping, helium and hydrogen are also implanted into the single crystal silicon substrate together with the impurity. In the case of helium, however, it is more easily discharged out of the single crystal silicon substrate through out-diffusion during the annealing step as compared with other atoms. Therefore, there is obtained a significant advantage that desirable crystal recovery takes place in the annealing step, and it is therefore possible to obtain a PN junction having a small junction leak current.

For these reasons, it is particularly preferred to use helium as the diluent gas.

In the method for manufacturing a semiconductor device of the present invention, in the step (d), an emission intensity li of the ignition gas may be measured, and the application of the bias voltage to the substrate may be started after the measured value becomes less than or equal to a predetermined value. Then, the amount of the ignition gas remaining in the chamber can be easily and reliably monitored by using a spectrometric apparatus, and it is therefore possible to reliably determine the attenuation of the amount of the ignition gas remaining. Therefore, it is possible to apply a bias to the substrate so as not to cause chipping of the upper corner due to the ignition gas.

In the step (d), in a case where an emission intensity li of the ignition gas is measured, and the application of the bias voltage to the substrate is started after the measured value becomes less than or equal to a predetermined value, the predetermined value may be the emission intensity lp achieved when only the process gas is excited to discharge. That is, the emission intensity lp achieved when only the process gas is excited to discharge may be measured in advance in order to determine the timing for the start of the bias application. When the emission intensity li of the ignition gas becomes less than the emission intensity lp achieved when only the process gas is excited to discharge, it is believed that the amount of the ignition gas remaining in the chamber is generally equal to the slight amount that is naturally contained in the chamber, in the process gas, etc. Therefore, if the bias application is started at or after this point in time, the amount of chipping of the upper corner of the semiconductor region is generally equal to that when only the process gas is excited to discharge. That is, the chipping (rounding) of the upper corner of the semiconductor region can be made very small.

In the step (d), in a case where an emission intensity li of the ignition gas is measured, and the application of the bias voltage to the substrate is started after the measured value becomes less than or equal to a predetermined value, it is preferred that the measurement wavelength of the emission intensity li of the ignition gas is not included among the emission wavelengths characteristic of the process gas. That is, when selecting the measurement wavelength of the emission intensity li of the ignition gas, a wavelength at which the emission intensity is high and which is not included among the emission wavelengths characteristic of the process gas is selected from among the emission wavelengths characteristic of the ignition gas. Then, the emission intensity li of the ignition gas can be measured precisely, and it is therefore possible to determine the amount of the ignition gas remaining in the chamber with a high precision. Specifically, it is preferred that the measurement wavelength is 693 nm when the ignition gas contains Ne, the measurement wavelength is 750 nm when the ignition gas contains Ar, the measurement wavelength is 823 nm when the ignition gas contains Xe, the measurement wavelength is 744 nm when the ignition gas contains N, the measurement wavelength is 777 nm when the ignition gas contains O, the measurement wavelength is 704 nm when the ignition gas contains F, the measurement wavelength is 545 nm when the ignition gas contains S, the measurement wavelength is 309 nm when the ignition gas contains Cl, and the measurement wavelength is 478 nm when the ignition gas contains Br.

Note that in the method for manufacturing a semiconductor device of the present invention, in the step (c), the process gas may be introduced into the chamber after confirming attenuation of the amount of the ignition gas remaining in the chamber.

Advantages of the Invention

According to the present invention, it is possible to realize a plasma doping for a fin-shaped semiconductor region, where it is possible to reliably prevent the chipping of the upper corner while maintaining a high throughput.

BRIEF DESCRIPTION OF THE DRAWINGS

FIGS. 2(a) and (b) are cross-sectional views showing main steps of a method for manufacturing a semiconductor device according to an embodiment of the present invention.

FIG. 5(a) schematically shows the shape of an etched protrusion-shaped silicon in a case where a bias voltage is applied when li≦lp in the temporal change of the ignition gas plasma emission intensity li shown in FIG. 3, and FIG. 5(b) schematically shows the shape of an etched protrusion-shaped silicon in a case where a bias voltage is applied when li>lp in the temporal change of the ignition gas plasma emission intensity li shown in FIG. 3.

FIGS. 7(a) and (b) are cross-sectional views showing main steps of a method for manufacturing a semiconductor device according to a comparative embodiment.

DESCRIPTION OF REFERENCE CHARACTERS

101 Subject substrate
102 Insulating layer
103 Fin-shaped semiconductor region
104 Impurity layer

DESCRIPTION OF EMBODIMENTS

Embodiments

Figure 1:
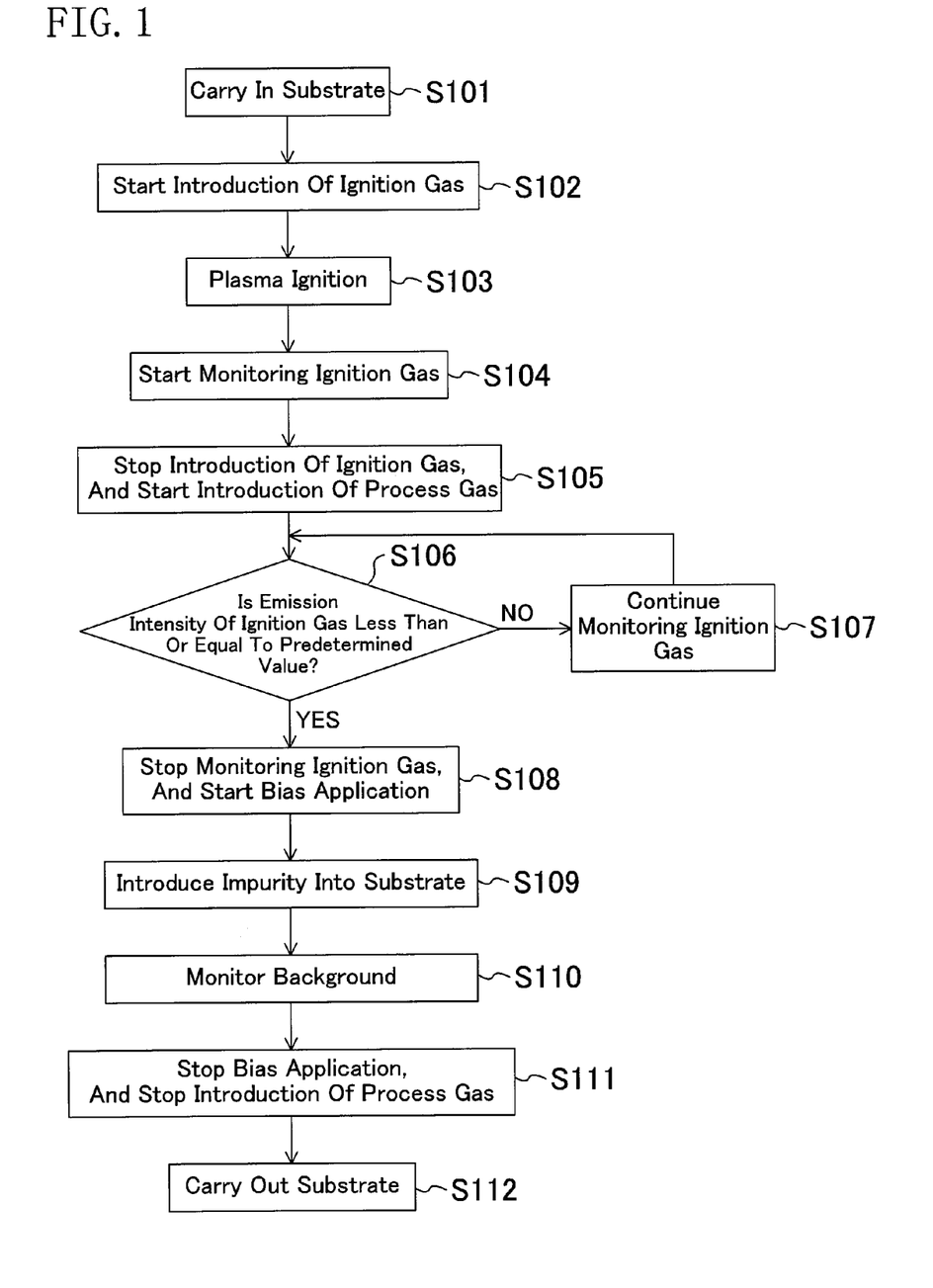
FIG. 1 is a flow chart of a method for manufacturing a semiconductor device according to an embodiment of the present invention.
Figure 2:
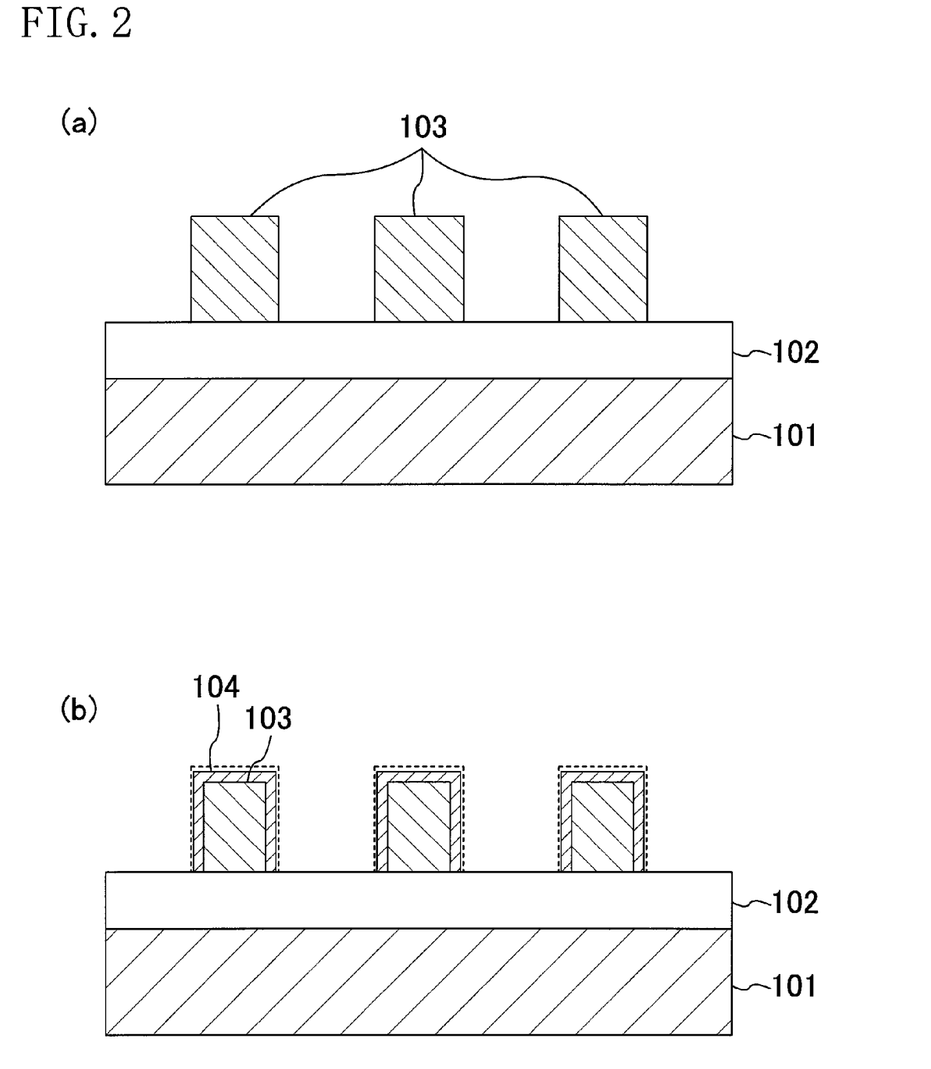

A method for manufacturing a semiconductor device, specifically, a method for manufacturing a semiconductor device using a plasma doping for impurity implantation, according to an embodiment of the present invention will now be described with reference to the drawings. FIG. 1 is a flow chart of a method for manufacturing a semiconductor device according to the present embodiment. FIGS. 2(a) and (b) are cross-sectional views showing main steps of the method for manufacturing a semiconductor device according to the present embodiment.

First, in step S101, a subject substrate 101 such as a single crystal silicon substrate, for example, is carried into a chamber (vacuum chamber) of a plasma doping apparatus. At this point, a plurality of semiconductor regions (fin-shaped semiconductor regions) 103 each having an upper surface and a side surface are formed on the subject substrate 101 with an insulating layer 102 interposed therebetween, as shown in FIG. 2(a). The fin-shaped semiconductor regions 103 are formed by, for example, etching a silicon layer. For example, the fin-shaped semiconductor regions 103 each have a square cross section whose width and height are both 30 nm, a rectangular cross section whose width is 30 nm and whose height is 100 nm, or a rectangular cross section whose width is 10 nm and whose height is 50 nm.

Then, in step S102, the process starts introducing a neon gas, for example, as an ignition gas, into the vacuum chamber. Note that gas supply and gas discharge take place simultaneously in and out of the vacuum chamber so as to maintain a pressure inside the vacuum chamber at a desired value, specifically, a pressure as close as possible to the optimal pressure for impurity doping to be described later. Instead of neon, the ignition gas may be a gas obtained by mixing together neon and helium at a ratio of 50% by mass to 50% by mass. A reason for this is that since helium is particularly desirable as a diluent gas for the process gas and neon is particularly desirable as an ignition gas, mixing them together gives an advantage of facilitating the ignition and an advantage of improving the productivity. Another reason is that since the process can transition from the ignition process to the doping process without losing the continuity, there is an advantage that the change in the impedance of the plasma is reduced, and it is possible to more easily achieve a match by the matcher. From these reasons, it is preferred to use, as an ignition gas, a gas obtained by mixing together neon and a diluent gas for the process gas, and it is particularly preferred to use helium as the diluent gas for the process gas.

Then, in step S103, a source power (plasma generation high-frequency power) is applied inside the vacuum chamber to thereby generate a plasma of the ignition gas. Here, conditions for the plasma ignition include, for example, a chamber pressure of 0.9 Pa, a source power of 250 W, and a substrate temperature of 20° C.

Then, in step S104, the process starts measuring the plasma emission intensity of the ignition gas, i.e., a neon gas, inside the vacuum chamber. The plasma emission intensity is measured by using a spectrometric apparatus, for example. The light of plasma emission is transmitted to the spectrometric apparatus through an optical fiber attached to the wall of the vacuum chamber, for example.

Then, in step S105, the process stops the introduction of the ignition gas into the vacuum chamber and simultaneously starts introducing the process gas into the vacuum chamber. While the process gas may be a gas containing an impurity such as boron or arsenic and diluted with helium (He) or hydrogen ($H_2$), it is $B_2H_6$ diluted with He in the present embodiment. Note that the $B_2H_6$ concentration in the process gas is 3% by mass, for example.

Then, in step S106, it is determined whether the measured value of the ignition gas plasma emission intensity li has become less than or equal to a predetermined value, specifically, the emission intensity lp achieved when only the process gas is excited to discharge. The emission intensity lp achieved when only the process gas is excited to discharge is measured in advance before the start of the plasma doping.

If it is determined in step S106 that the measured value of the ignition gas plasma emission intensity li has not become less than or equal to a predetermined value, the monitoring of the ignition gas plasma emission intensity li is continued in step S107, and the determination of step S106 is repeated.

On the other hand, if it is determined in step S106 that the measured value of the ignition gas plasma emission intensity li has become less than or equal to the predetermined value, the monitoring of the ignition gas plasma emission intensity li is stopped in step S108, and the process starts applying a bias voltage to the subject substrate 101. Thus, in step S109, an impurity (boron in the present embodiment) is introduced into the fin-shaped semiconductor region 103 as shown in FIG. 2(b), thereby forming an impurity layer 104 in the upper portion and the side portion of the fin-shaped semiconductor region 103. The conditions for the impurity introduction include, for example, a chamber pressure of 0.9 Pa, a source power of 500 W, a bias voltage (Vpp) of 200 V, a substrate temperature of 20° C., and an impurity doping time (bias voltage application time) of 30 sec. That is, in the present embodiment, the chamber pressure during the plasma ignition and the chamber pressure during the impurity introduction are equal at 0.9 Pa.

Note that while the shape of the fin-shaped semiconductor region 103 before the impurity doping of step S109 is denoted by a broken line in FIG. 2(b), there is seen substantially no chipping of the upper corner of the fin-shaped semiconductor region 103 during the impurity doping.

In the present embodiment, the background emission intensity, i.e., the emission intensity lp achieved when only the process gas is excited to discharge, is measured in step S110 while the impurity doping of step S109 is performed, and the measured value is used in the determination of step S106 during the next iteration of the plasma doping process.

Then, in step S111, the process stops the application of the bias voltage to the subject substrate 101, and also stops the introduction of the process gas into the vacuum chamber. That is, the process stops the impurity doping of step S109.

Finally, in step S112, the subject substrate 101 including the fin-shaped semiconductor region 103 with the impurity layer 104 formed thereon is carried out of the chamber (vacuum chamber) of the plasma doping apparatus.

As described above, according to the present embodiment, an ignition gas is used separately from a process gas, and it is therefore possible to generate a plasma with a low pressure. That is, since the pressure difference between the plasma ignition and the impurity doping can be reduced, the amount of time required for the pressure adjustment is substantially eliminated, and it is therefore possible to improve the throughput.

According to the present embodiment, a bias is applied to the substrate after confirming the attenuation of the amount of the ignition gas remaining in the chamber, and it is therefore possible to reliably prevent the chipping of the upper corner of the semiconductor region due to the ignition gas.

According to the present embodiment, a neon gas, which is easily excited to discharge, is used as the ignition gas, and it is therefore possible to easily generate a plasma even with a pressure as low as that during the impurity doping, thus reliably improving the throughput. Since a neon gas is chemically stable, it is possible to stably perform the plasma doping process. Similar advantages can be obtained when a rare gas such as an argon (Ar) gas or a xenon (Xe) gas is used as the ignition gas, instead of a neon (Ne) gas. Also when the ignition gas contains N, O, S, Cl or Br, it is possible to easily generate a plasma even with a pressure as low as that during the impurity doping, thus reliably improving the throughput. Note that if a neon gas is used as the ignition gas, it is possible to more reliably prevent the chipping (rounding) of the upper corner of the semiconductor region since the atomic weight of neon is smaller than those of Ar, etc.

According to the present embodiment, the process gas contains a diluent gas made of He (helium) having a low etch rate to a semiconductor, and it is therefore possible to more reliably prevent the chipping (rounding) of the upper corner of the semiconductor region. Since helium is chemically stable, it is possible to stably perform the plasma doping process. Similar advantages can be obtained when the diluent gas is made of $H_2$ (hydrogen).

According to the present embodiment, the process starts measuring the ignition gas plasma emission intensity li in step S106, and the application of a bias voltage to the subject substrate 101 is started only after the measured value becomes less than or equal to a predetermined value. Therefore, the amount of the ignition gas remaining in the chamber can be easily and reliably monitored by using a spectrometric apparatus, and it is therefore possible to reliably determine the attenuation of the amount of the ignition gas remaining. Therefore, it is possible to apply a bias to the substrate so as not to cause chipping of the upper corner due to the ignition gas. Since the emission intensity lp achieved when only the process gas is excited to discharge is used as the predetermined value, it is believed that the amount of the ignition gas remaining in the chamber at the start of the bias application is generally equal to the slight amount that is naturally contained in the chamber, in the process gas, etc. Therefore, the amount of chipping of the upper corner of the semiconductor region resulting from the bias application is generally equal to that when only the process gas is excited to discharge. That is, the chipping (rounding) of the upper corner of the semiconductor region can be made very small.

Figure 3:
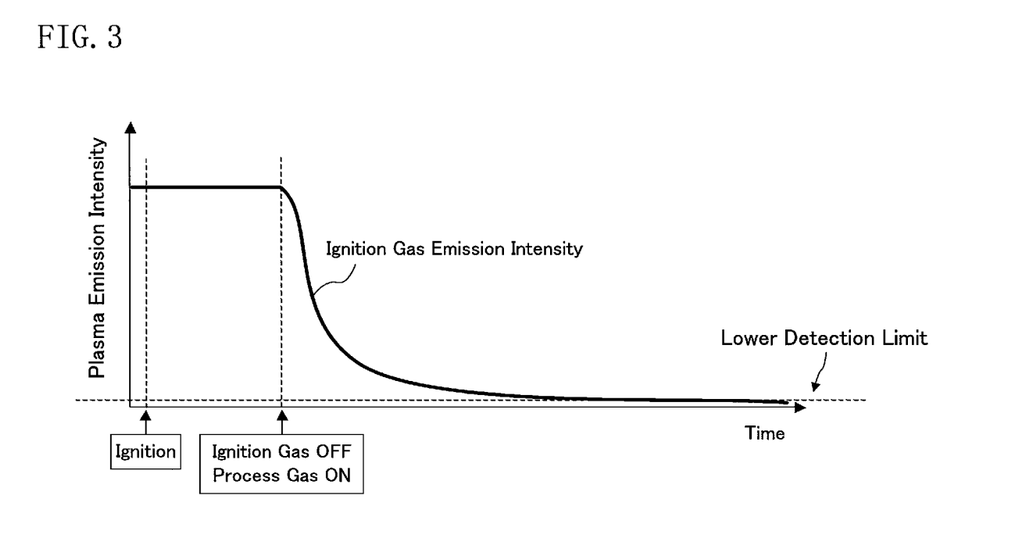
FIG. 3 shows an example of a temporal change of a plasma emission intensity of an ignition gas in a case where a plasma doping is performed in a method for manufacturing a semiconductor device according to an embodiment of the present invention.

FIG. 3 shows an example of a temporal change of the plasma emission intensity of the ignition gas in a case where a plasma doping of the present embodiment is performed. As shown in FIG. 3, the plasma emission intensity of the ignition gas, i.e., the amount of the ignition gas remaining in the vacuum chamber, decreases over time after stopping the introduction of the ignition gas into the vacuum chamber while simultaneously starting the introduction of the process gas into the vacuum chamber. Note however that when the amount of the ignition gas remaining in the chamber comes close to the slight amount that is naturally contained in the chamber, in the process gas, etc., the decrease in the plasma emission intensity of the ignition gas becomes gentle, and the plasma emission intensity eventually reaches the detection limit (lower limit).

Figure 4:
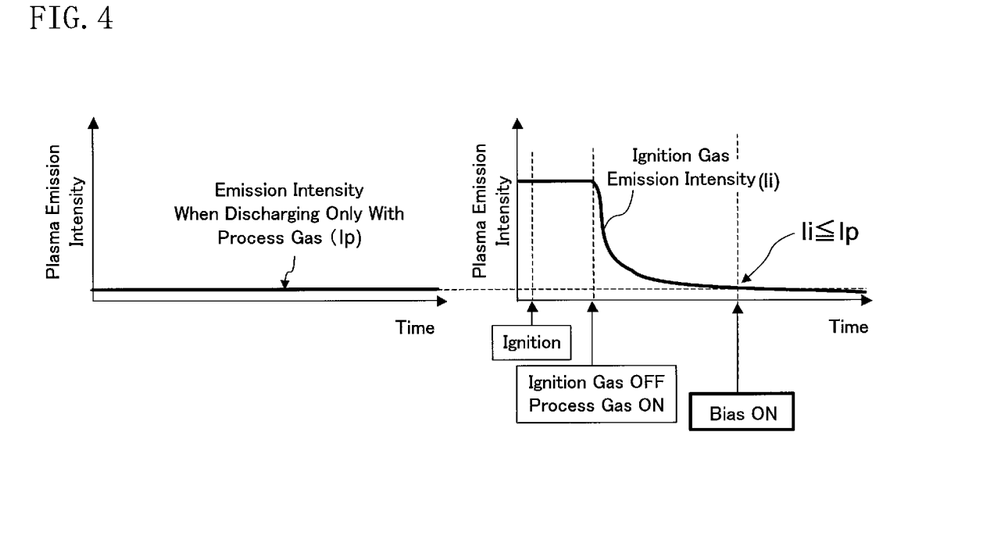
FIG. 4 shows a case where a bias voltage is applied when the ignition gas plasma emission intensity li becomes less than the emission intensity lp, which is achieved when only the process gas is excited to discharge, in the temporal change of li shown in FIG. 3.

FIG. 4 shows a case where a bias voltage is applied when the ignition gas plasma emission intensity li becomes less than the emission intensity lp, which is achieved when only the process gas is excited to discharge, in the temporal change of li shown in FIG. 3.

Figure 5:
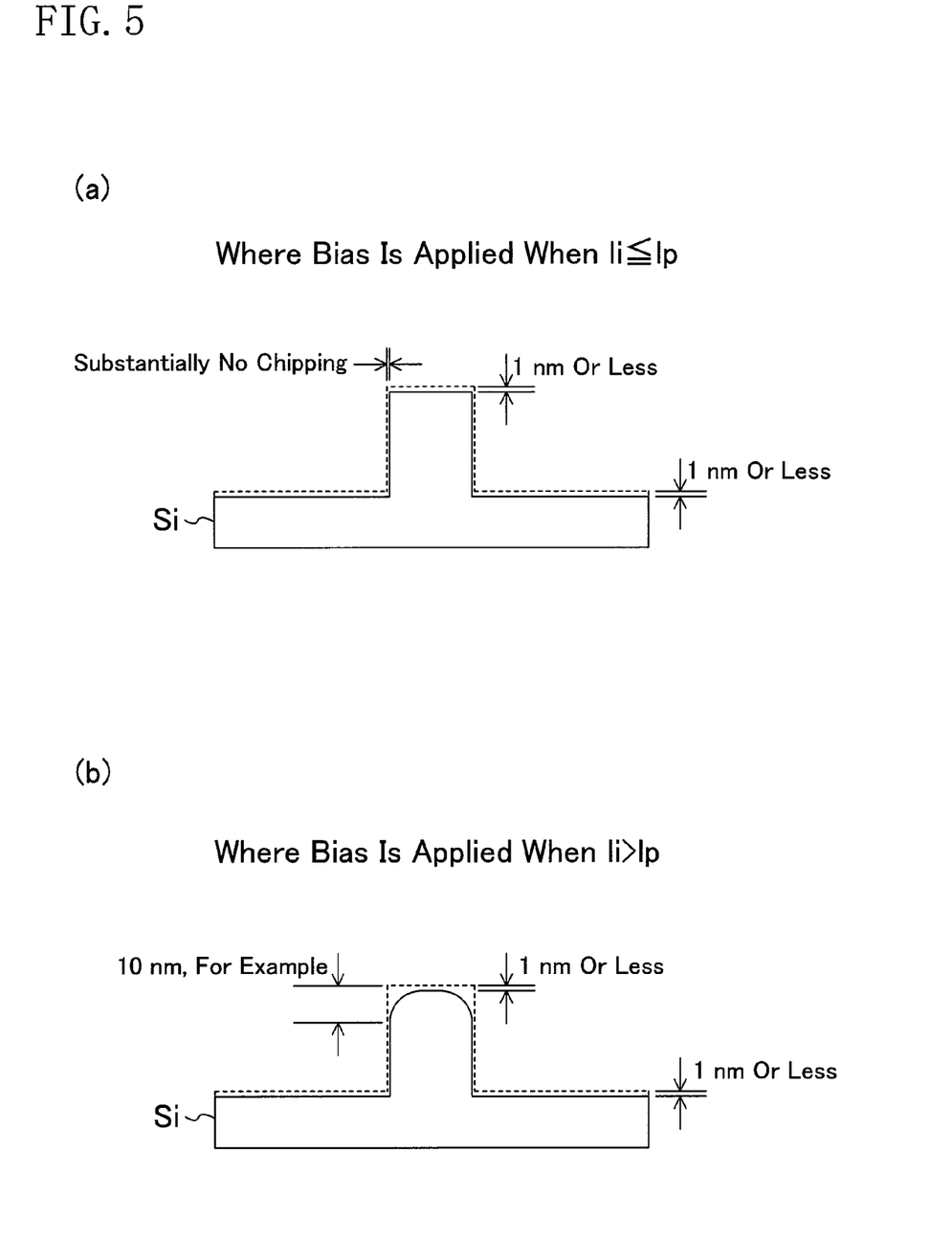

FIG. 5(a) schematically shows the shape of an etched protrusion-shaped silicon in a case where a bias voltage is applied when li≦lp in the temporal change of the ignition gas plasma emission intensity li shown in FIG. 3. Note that in FIG. 5(a), the shape before etching is denoted by a broken line, and the shape after etching is denoted by a solid line. As shown in FIG. 5(a), if the bias voltage is applied when li≦lp, the amount of etching of the upper surface of the protruding portion of the protrusion-shaped silicon, including the corner, is reduced to less than or equal to 1 nm, which is generally equal to the amount of etching of the upper surface of the base portion of the protrusion-shaped silicon.

On the other hand, FIG. 5(b) schematically shows the shape of an etched protrusion-shaped silicon in a case where a bias voltage is applied when li>lp in the temporal change of the ignition gas plasma emission intensity li shown in FIG. 3. Note that in FIG. 5(b), the shape before etching is denoted by a broken line, and the shape after etching is denoted by a solid line. As shown in FIG. 5(b), if the bias voltage is applied when li>lp, the amount of etching of the upper surface of the protruding portion of the protrusion-shaped silicon, excluding the corner, is reduced to less than or equal to 1 nm, which is generally equal to the amount of etching of the upper surface of the base portion of the protrusion-shaped silicon, but the amount of etching of the corner of the protruding portion is very large and can reach as high as about 10 nm.

Note that in the present embodiment, it is preferred that the measurement wavelength of the emission intensity li of the ignition gas is not included among the emission wavelengths characteristic of the process gas. That is, when selecting the measurement wavelength of the emission intensity li of the ignition gas, a wavelength at which the emission intensity is high and which is not included among the emission wavelengths characteristic of the process gas is selected from among the emission wavelengths characteristic of the ignition gas. Then, the emission intensity li of the ignition gas can be measured precisely, and it is therefore possible to determine the amount of the ignition gas remaining in the chamber with a high precision.

For example, the emission wavelengths characteristic of the ignition gas are 332 nm, 378 nm, 693 nm, 703 nm, 838 nm and 1118 nm for Ne, 707 nm, 750 nm, 764 nm, 812 nm and 912 nm for Ar, 484 nm, 542 nm, 823 nm and 882 nm for Xe, 120 nm, 575 nm and 744 nm for N, 397 nm, 465 nm and 777 nm for O, 686 nm and 704 nm for F, 143 nm, 181 nm and 545 nm for S, 256 nm and 309 nm for Cl, and 470 nm, 478 nm and 481 nm for Br. On the other hand, the emission wavelengths characteristic of the process gas (accurately, the emission wavelengths of the diluent gas, which accounts for the most part of the process gas) are 122 nm, 486 nm and 656 nm for H, and 389 nm, 588 nm, 1083 nm and 2059 nm for He. Therefore, the preferred measurement wavelength of the ignition gas is, for example, 693 nm for Ne, 750 nm for Ar, 823 nm for Xe, 744 nm for N, 777 nm for O, 704 nm for F, 545 nm for S, 309 nm for Cl, and 478 nm for Br.

In the present embodiment, the process stops the introduction of the ignition gas into the vacuum chamber and simultaneously starts introducing the process gas into the vacuum chamber in step S105. Alternatively, the process may stop the introduction of the ignition gas into the vacuum chamber, and then introduce the process gas into the vacuum chamber after confirming the attenuation of the amount of the ignition gas remaining in the vacuum chamber. Specifically, the process may start the introduction of the process gas into the vacuum chamber when the measured value of the ignition gas plasma emission intensity li becomes less than or equal to a predetermined value, e.g., the emission intensity lp achieved when only the process gas is excited to discharge, after stopping the introduction of the ignition gas into the vacuum chamber, after which the process may start applying a bias voltage to the subject substrate 101.

Comparative Embodiment

Figure 6:
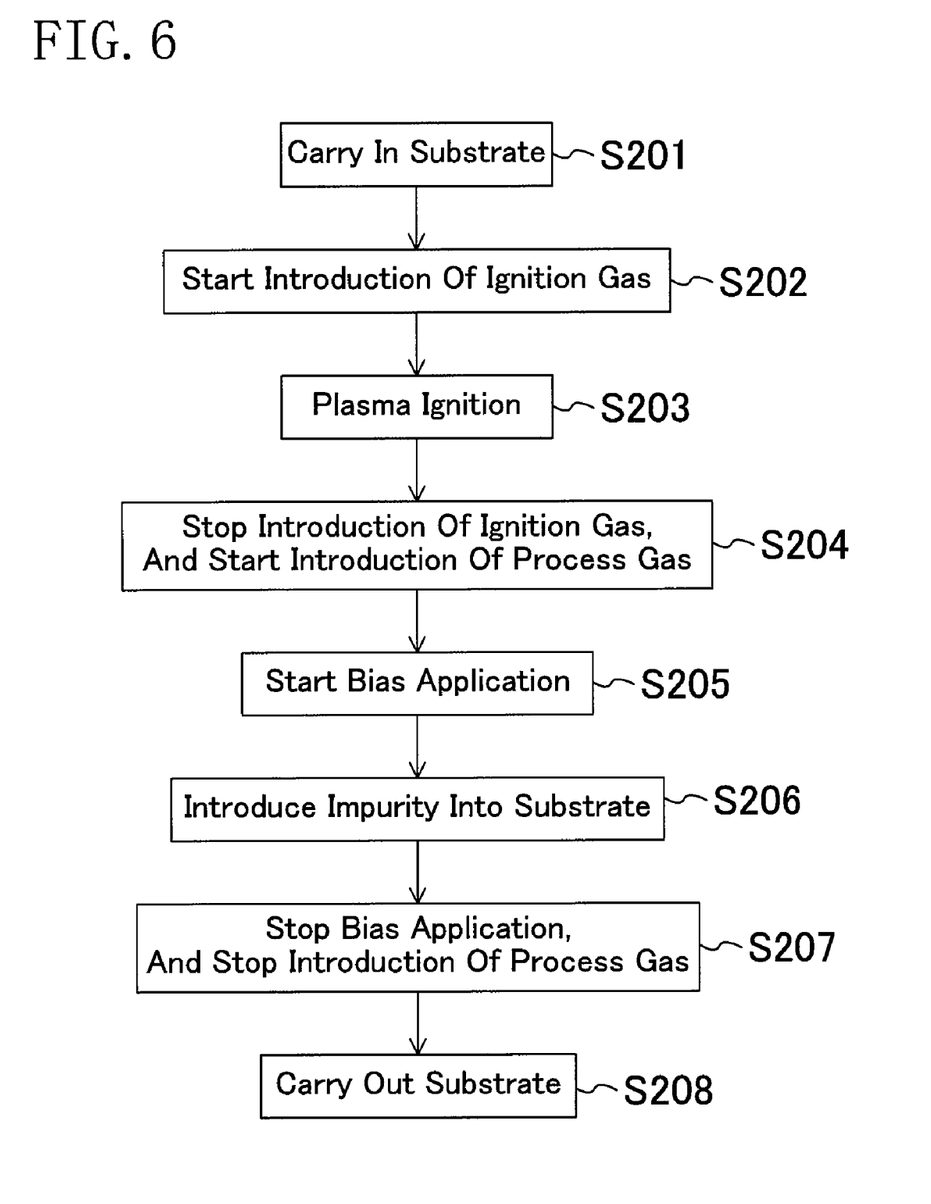
FIG. 6 is a flow chart of a method for manufacturing a semiconductor device according to a comparative embodiment.
Figure 7:
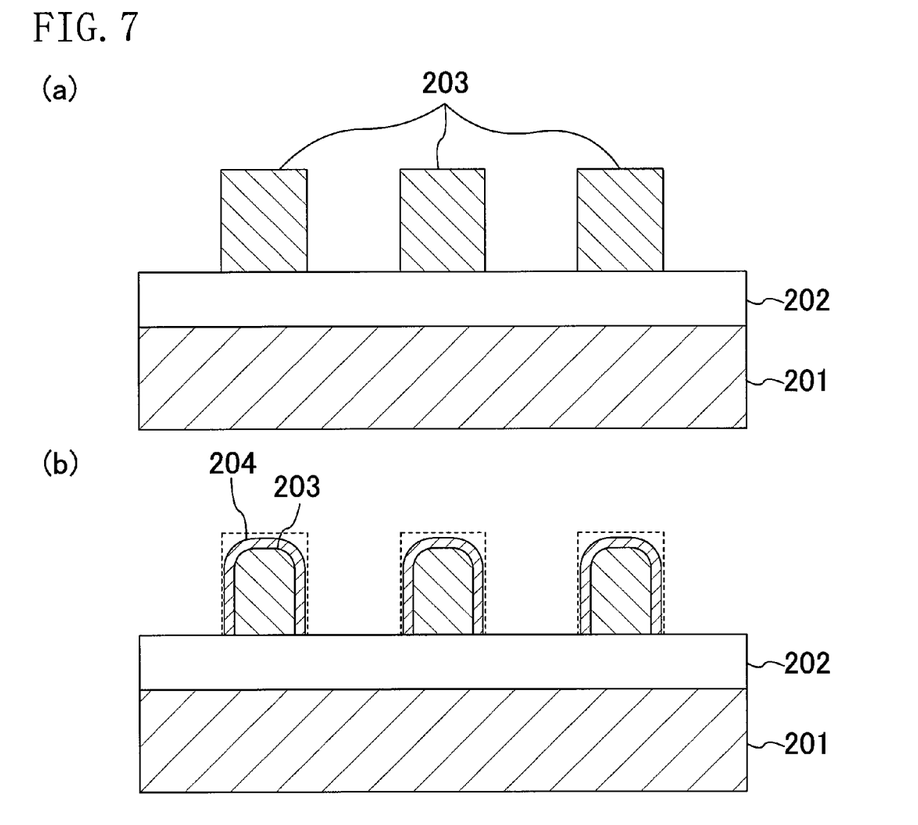

A method for manufacturing a semiconductor device, specifically, a method for manufacturing a semiconductor device using a plasma doping for impurity implantation, according to a comparative embodiment will now be described with reference to the drawings. FIG. 6 is a flow chart of a method for manufacturing a semiconductor device according to a comparative embodiment. FIGS. 7(a) and (b) are cross-sectional views showing main steps of a method for manufacturing a semiconductor device according to a comparative embodiment.

First, in step S201, a subject substrate 201 is carried into a chamber (vacuum chamber) of a plasma doping apparatus. At this point, a plurality of semiconductor regions (fin-shaped semiconductor regions) 203 each having an upper surface and a side surface are formed on the subject substrate 201 with an insulating layer 202 interposed therebetween, as shown in FIG. 7(a). The fin-shaped semiconductor regions 203 are formed by, for example, etching a silicon layer.

Then, in step S202, the process starts introducing an argon gas, for example, as an ignition gas, into the vacuum chamber. Note that gas supply and gas discharge take place simultaneously in and out of the vacuum chamber so as to maintain a pressure inside the vacuum chamber at a desired value, specifically, a pressure as close as possible to the optimal pressure for impurity doping to be described later.

Then, in step S203, a source power (plasma generation high-frequency power) is applied inside the vacuum chamber to thereby generate a plasma of the ignition gas. Here, conditions for the plasma ignition include, for example, a chamber pressure of 0.9 Pa, a source power of 250 W, and a substrate temperature of 20° C.

Then, in step S204, the process stops the introduction of the ignition gas into the vacuum chamber and simultaneously starts introducing the process gas into the vacuum chamber. While the process gas may be a gas containing an impurity such as boron or arsenic and diluted with helium (He) or hydrogen ($H_2$), it is $B_2H_6$ diluted with He in the present comparative embodiment. Note that the $B_2H_6$ concentration in the process gas is 3% by mass, for example.

Then, in step S205, the process starts applying a bias voltage to the subject substrate 201. Thus, in step S206, an impurity (boron in the present comparative embodiment) is introduced into the fin-shaped semiconductor region 203 as shown in FIG. 7(b), thereby forming an impurity layer 204 in the upper portion and the side portion of the fin-shaped semiconductor region 203. The conditions for the impurity introduction include, for example, a chamber pressure of 0.9 Pa, a source power of 500 W, a bias voltage (Vpp) of 200 V, a substrate temperature of 20° C., and an impurity doping time (bias voltage application time) of 30 sec. That is, in the present comparative embodiment, the chamber pressure during the plasma ignition and the chamber pressure during the impurity introduction are equal at 0.9 Pa.

Note that while the shape of the fin-shaped semiconductor region 203 before the impurity doping of step S206 is denoted by a broken line in FIG. 7(b), there is seen quite significant chipping of the upper corner of the fin-shaped semiconductor region 203 during the impurity doping.

Then, in step S207, the process stops the application of the bias voltage to the subject substrate 201, and also stops the introduction of the process gas into the vacuum chamber. That is, the process stops the impurity doping of step S206.

Finally, in step S208, the subject substrate 201 including the fin-shaped semiconductor region 203 with the impurity layer 204 formed thereon is carried out of the chamber (vacuum chamber) of the plasma doping apparatus.

Figure 8:
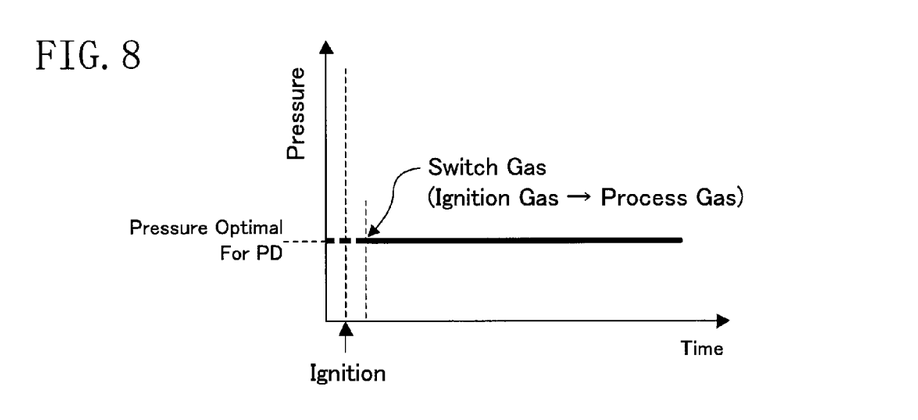
FIG. 8 shows an example of a temporal change of the pressure inside the chamber in a case where a plasma doping is performed in a method for manufacturing a semiconductor device according to a comparative embodiment.

FIG. 8 shows an example of a temporal change of the pressure inside the chamber in the case where a plasma doping (PD) according to the comparative embodiment is performed. As shown in FIG. 8, according to the comparative embodiment, an ignition gas is used separately from a process gas, and it is therefore possible to generate a plasma with a low pressure. That is, since the pressure difference between the plasma ignition and the impurity doping can be reduced, the amount of time required for the pressure adjustment is substantially eliminated, and it is therefore possible to improve the throughput.

Figure 9:
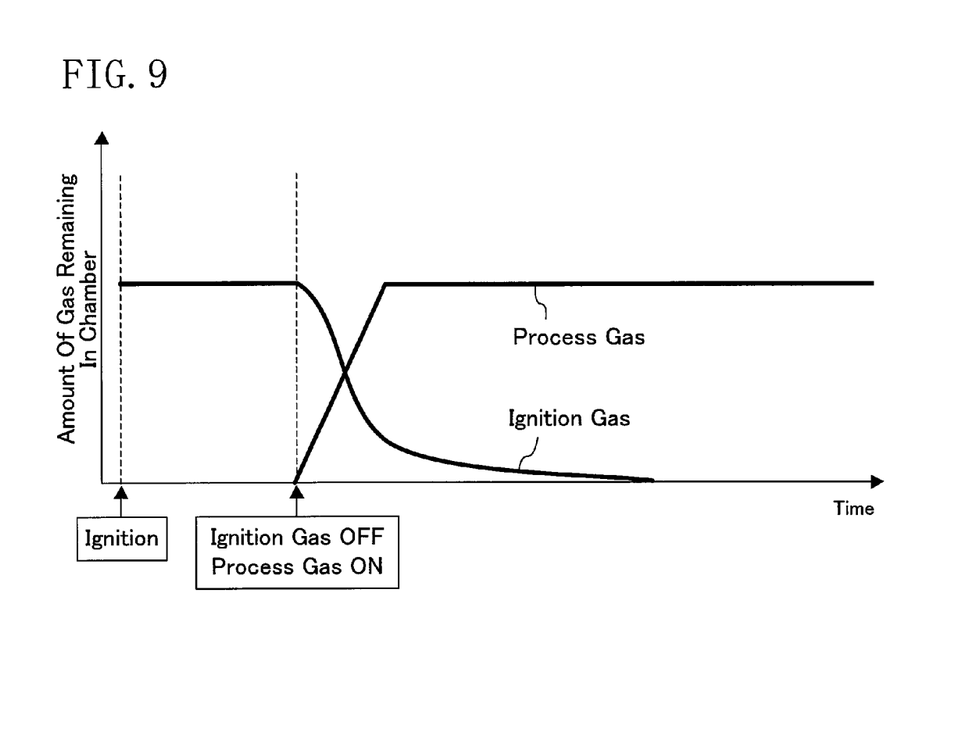
FIG. 9 shows an example of a temporal change of the amount of each gas remaining in the chamber in a case where a plasma doping is performed in a method for manufacturing a semiconductor device according to a comparative embodiment.

FIG. 9 shows an example of a temporal change of the amount of each gas remaining in the chamber in the case where a plasma doping according to the comparative embodiment is performed. As shown in FIG. 9, after a plasma is generated using an ignition gas, and then the supply of the process gas is started while stopping the supply of the ignition gas, the ignition gas remains in the chamber for a while.

In the comparative embodiment, a bias voltage is applied to the subject substrate 201 without confirming the attenuation of the amount of the ignition gas remaining in the chamber. Therefore, the supply of the process gas and the application of the bias are started while the ignition gas remains in the chamber. Moreover, the argon gas, which is used as the ignition gas, has a relatively high etch rate to a semiconductor such as silicon. This results in the quite significant chipping of the upper corner of the fin-shaped semiconductor region 203 during the impurity doping, as shown in FIG. 7(b).

That is, according to the comparative embodiment, there is a high possibility that the shape of a 3D device such as a three-dimensional transistor is deformed to an unacceptable degree.

INDUSTRIAL APPLICABILITY

The present invention is directed to a method for manufacturing a semiconductor device, and is very useful when it is used in the formation of a 3D device such as a three-dimensional transistor, where an advantage is obtained that it is possible to reliably prevent the chipping of the upper corner of the semiconductor region while maintaining a high throughput.

The invention claimed is:

1. A method for manufacturing a semiconductor device, comprising the steps of:

(a) forming a semiconductor region having an upper surface and a side surface on a substrate;

(b) introducing an ignition gas into a chamber to thereby turn the ignition gas into a plasma after the substrate is placed in the chamber, after the step (a);

(c) introducing a process gas containing an impurity into the chamber to thereby turn the process gas into a plasma, after the step (b); and (d) applying a bias voltage to the substrate so as to dope the semiconductor region with the impurity after confirming attenuation of an amount of the ignition gas remaining in the chamber, after the step (c).

2. The method for manufacturing a semiconductor device of claim 1, wherein the ignition gas contains a rare gas.

3. The method for manufacturing a semiconductor device of claim 2, wherein the rare gas is Ne.

4. The method for manufacturing a semiconductor device of claim 2, wherein the rare gas is Ar or Xe.

5. The method for manufacturing a semiconductor device of claim 1, wherein the ignition gas contains N, O, S, Cl or Br.

6. The method for manufacturing a semiconductor device of claim 1, wherein the process gas contains a diluent gas.

7. The method for manufacturing a semiconductor device of claim 6, wherein the diluent gas is He or $H_2$.

8. The method for manufacturing a semiconductor device of claim 1, wherein
in the step (d), an emission intensity li of the ignition gas is measured, and the application of the bias voltage to the substrate is started after the measured value becomes less than or equal to a predetermined value.

9. The method for manufacturing a semiconductor device of claim 8, wherein
the predetermined value is an emission intensity lp achieved when only the process gas is excited to discharge.

10. The method for manufacturing a semiconductor device of claim 8, wherein
a measurement wavelength of the emission intensity li of the ignition gas is not included among emission wavelengths characteristic of the process gas.

11. The method for manufacturing a semiconductor device of claim 10, wherein
the measurement wavelength is 693 nm when the ignition gas contains Ne,
the measurement wavelength is 750 nm when the ignition gas contains Ar,
the measurement wavelength is 823 nm when the ignition gas contains Xe,
the measurement wavelength is 744 nm when the ignition gas contains N,
the measurement wavelength is 777 nm when the ignition gas contains O,
the measurement wavelength is 704 nm when the ignition gas contains F,
the measurement wavelength is 545 nm when the ignition gas contains S,
the measurement wavelength is 309 nm when the ignition gas contains Cl, and
the measurement wavelength is 478 nm when the ignition gas contains Br.

12. The method for manufacturing a semiconductor device of claim 1, wherein
in the step (c), the process gas is introduced into the chamber after confirming attenuation of an amount of the ignition gas remaining in the chamber.

* * * * *